(12) United States Patent
Hsu

(10) Patent No.: US 10,839,872 B2
(45) Date of Patent: Nov. 17, 2020

(54) RANDOM BIT CELL USING AN INITIAL STATE OF A LATCH TO GENERATE A RANDOM BIT

(71) Applicant: eMemory Technology Inc., Hsin-Chu (TW)

(72) Inventor: Ching-Hsiang Hsu, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/393,899

(22) Filed: Apr. 24, 2019

(65) Prior Publication Data

US 2020/0013438 A1 Jan. 9, 2020

Related U.S. Application Data

(60) Provisional application No. 62/693,481, filed on Jul. 3, 2018.

(51) Int. Cl.
| | | |
|---|---|---|
| *G11C 7/10* | (2006.01) | |
| *G11C 7/12* | (2006.01) | |
| *G11C 7/14* | (2006.01) | |
| *G06F 7/58* | (2006.01) | |

(52) U.S. Cl.
CPC .............. *G11C 7/106* (2013.01); *G06F 7/588* (2013.01); *G11C 7/12* (2013.01); *G11C 7/14* (2013.01)

(58) Field of Classification Search
CPC .. G11C 7/106; G11C 7/12; G11C 7/14; G06F 7/588
See application file for complete search history.

(56) References Cited

U.S. PATENT DOCUMENTS

| | | | | |
|---|---|---|---|---|
| 8,854,872 B2 * | 10/2014 | Lam | ..................... | G11C 11/5628 365/148 |
| 8,947,913 B1 | 2/2015 | Derhacobian | | |
| 9,105,432 B2 | 8/2015 | Kim | | |
| 9,330,755 B1 * | 5/2016 | Van Buskirk | ........ | G11C 13/004 |
| 9,729,334 B2 | 8/2017 | Choi | | |
| 2012/0020159 A1 | 1/2012 | Ong | | |

(Continued)

FOREIGN PATENT DOCUMENTS

| | | |
|---|---|---|
| CN | 101252018 | 6/2010 |
| EP | 3 340 247 A1 | 6/2018 |
| JP | 2014-522134 A | 8/2014 |

*Primary Examiner* — Gene N Auduong
(74) *Attorney, Agent, or Firm* — Winston Hsu

(57) ABSTRACT

A random bit cell includes a latch, a voltage selector, a first non-volatile storage element, and a second non-volatile storage element. The latch has a first terminal coupled to a first local bit line, and a second terminal coupled to a second local bit line. The first non-volatile storage element has a first terminal coupled to the first local bit line, and a second terminal coupled to the voltage selector. The second non-volatile storage element has a first terminal coupled to the second local bit line, and a second terminal coupled to the voltage selector. During an initial operation, the first terminals of the first non-volatile storage element and the second non-volatile storage element are floating. During an enroll operation, the first terminals of the first non-volatile storage element and the second non-volatile storage element receive a program voltage from the voltage selector.

20 Claims, 3 Drawing Sheets

(56) References Cited

U.S. PATENT DOCUMENTS

2014/0355330 A1* 12/2014 Endoh .............. H03K 3/356139
   365/148
2017/0301406 A1  10/2017 Wong

* cited by examiner

US 10,839,872 B2

RANDOM BIT CELL USING AN INITIAL STATE OF A LATCH TO GENERATE A RANDOM BIT

CROSS REFERENCE TO RELATED APPLICATIONS

This non-provisional application claims priority of U.S. provisional application No. 62/693,481, filed on Jul. 3, 2018, included herein by reference in its entirety.

BACKGROUND OF THE INVENTION

1. Field of the Invention

The present invention is related to a random bit cell, and more particular, to a random bit cell with non-volatile storage elements.

2. Description of the Prior Art

To prevent electronic devices from being accessed by unauthorized persons, manufacturers of electronic devices often need to invest a significant amount of time and money to develop countermeasures to avoid external threats. In the prior art, the physical unclonable function (PUF) circuit is often applied to protect the system from physical attacks and reverse engineering due to the intrinsic characteristics of the PUF circuit. The PUF circuit can generate random numbers based on unpredictable physical characteristics.

The static random access memory (SRAM) has been used to implement the physical unclonable function circuit for generating random numbers since the latch of each SRAM cell is strongly dependent on the initial charge status of the SRAM cell and the initial charge status of the SRAM cell is unpredictable and uncontrollable. However, since the random number stored by the latch of the SRAM cell is volatile, it has to be regenerated every time when the power is reset. Furthermore, the initial charge state of the SRAM cell is significantly affected by the ambient noise and the surrounding environment. Therefore, as the power goes on and off, the initial charge state of the SRAM cell may be changed, thereby changing the value of the random number and causing instability of the security system employing the random number.

SUMMARY OF THE INVENTION

One embodiment of the present invention discloses a random bit cell. The random bit cell includes a latch, a voltage selector, a first non-volatile storage element, and a second non-volatile storage element.

The latch has a first terminal coupled to a first local bit line, and a second terminal coupled to a second local bit line. The voltage selector has a first floating terminal, a second floating terminal, a program terminal for providing a program voltage, and a pre-charge terminal for providing a pre-charge voltage. The first non-volatile storage element has a first terminal coupled to the first local bit line, and a second terminal coupled to the voltage selector. The second non-volatile storage element has a first terminal coupled to the second local bit line, and a second terminal coupled to the voltage selector.

During an initial operation, the latch settles the first local bit line and the second local bit line to a first reference voltage and a second reference voltage greater than the first reference voltage according to an initial charge state of the latch, and the voltage selector couples the second terminal of the first non-volatile storage element to the first floating terminal, and the second terminal of the second non-volatile storage element to the second floating terminal.

During an enroll operation, the voltage selector couples the second terminal of the first non-volatile storage element and the second terminal of the second non-volatile storage element to the program terminal.

During a read operation, the voltage selector couples the second terminal of the first non-volatile storage element and the second terminal of the second non-volatile storage element to the pre-charge terminal, and a random bit of the random bit cell is read by sensing voltages on the first local bit line and the second bit line.

Another embodiment of the present invention discloses a random number generator. The random number generator includes a plurality of address bit lines, and a plurality of random bit cells. Each of the random bit cells includes a latch, a voltage selector, a bit line select circuit, a first non-volatile storage element, and a second non-volatile storage element.

The latch has a first terminal coupled to a first local bit line, and a second terminal coupled to a second local bit line. The bit line select circuit is coupled to the first local bit line, the second local bit line, a first corresponding address bit line of the plurality of address bit lines, and a second corresponding address bit line of the plurality of address bit lines. The voltage selector has a first floating terminal, a second floating terminal, a program terminal for providing a program voltage, and a pre-charge terminal for providing a pre-charge voltage. The first non-volatile storage element has a first terminal coupled to the first local bit line, and a second terminal coupled to the voltage selector. The second non-volatile storage element has a first terminal coupled to the second local bit line, and a second terminal coupled to the voltage selector.

During an initial operation of the random bit cell, the latch settles the first local bit line and the second local bit line to a first reference voltage and a second reference voltage greater than the first reference voltage according to an initial charge state of the latch, and the voltage selector couples the second terminal of the first non-volatile storage element to the first floating terminal, and the second terminal of the second non-volatile storage element to the second floating terminal.

During an enroll operation of the random bit cell, the voltage selector couples the second terminal of the first non-volatile storage element and the second terminal of the second non-volatile storage element to the program terminal.

During a read operation, the voltage selector couples the second terminal of the first non-volatile storage element and the second terminal of the second non-volatile storage element to the pre-charge terminal, and a random bit of the random bit cell is read by sensing voltages on the first local bit line and the second bit line.

Another embodiment of the present invention discloses a method for operating a random bit cell. The random bit cell comprising a latch having a first terminal coupled to a first local bit line, and a second terminal coupled to a second local bit line, a first non-volatile storage element having a first terminal coupled to the first local bit line, and a second terminal, and a second non-volatile storage element having a first terminal coupled to the second local bit line, and a second terminal.

During an initial operation, the second terminal of the first non-volatile storage element and the second terminal of the second non-volatile storage element are floating. The latch settles the first local bit line and the second local bit line to a first reference voltage and a second reference voltage greater than the first reference voltage according to an initial charge state of the latch.

During an enroll operation, a program voltage is applied to the second terminal of the first non-volatile storage element and the second terminal of the second non-volatile storage element.

During a read operation, a pre-charge voltage is applied to the second terminal of the first non-volatile storage element and the second terminal of the second non-volatile storage element, and voltages on the first local bit line and the second bit line are sensed to output a random bit of the random bit cell.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
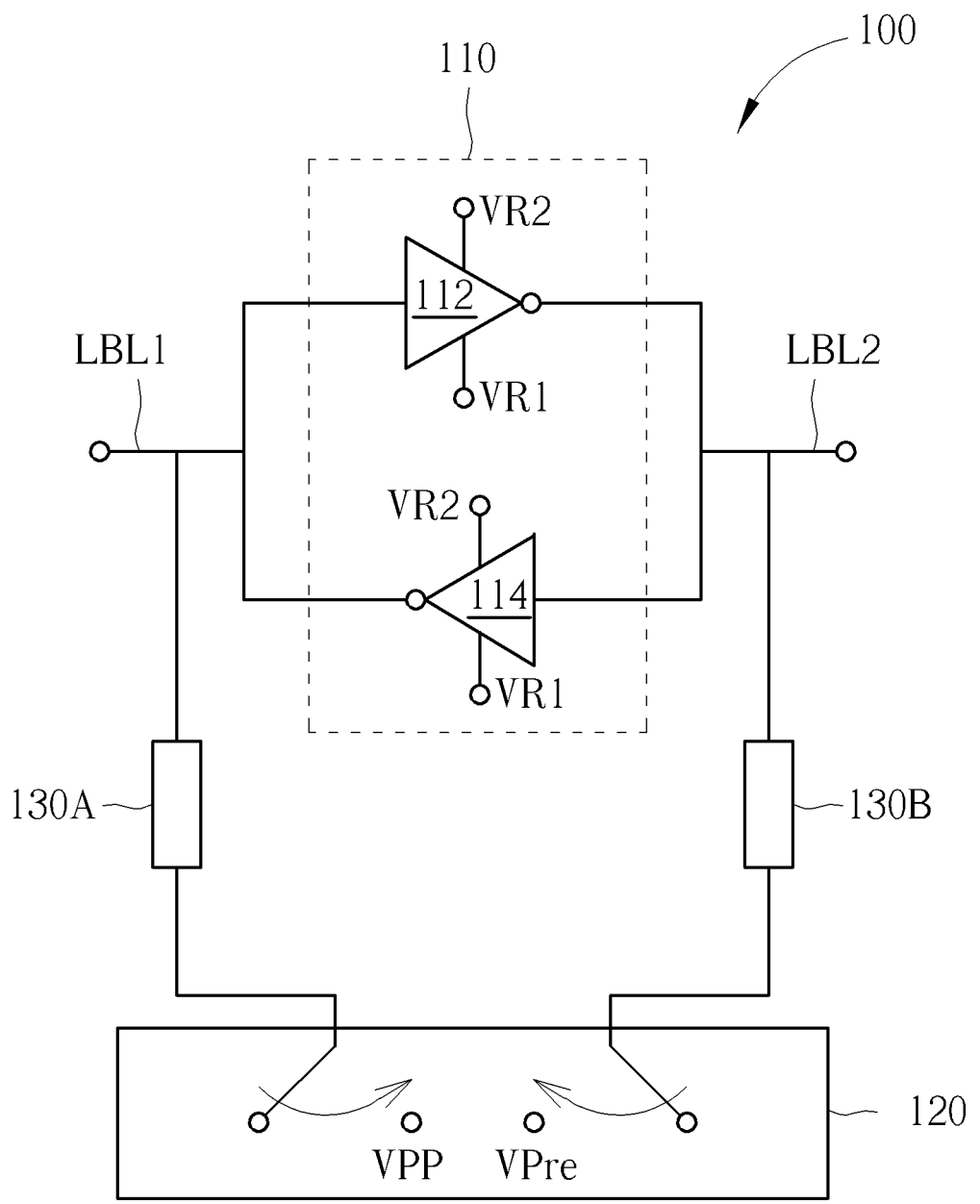
FIG. 1 shows a random bit cell according to one embodiment of the present invention.

FIG. 1 shows a random bit cell 100 according to one embodiment of the present invention. The random bit cell 100 includes a latch 110, a voltage selector 120, and non-volatile storage elements 130A and 130B.

The latch 110 has a first terminal coupled to a local bit line LBL1, and a second terminal coupled to a local bit line LBL2. The non-volatile storage element 130A has a first terminal coupled to the local bit line LBL1, and a second terminal coupled to the voltage selector 120. The non-volatile storage element 130B has a first terminal coupled to the local bit line LBL2, and a second terminal coupled to the voltage selector 120.

In FIG. 1, the latch 110 includes inverters 112 and 114. The inverter 112 has an input terminal coupled to the local bit line LBL1, an output terminal coupled to the local bit line LBL2, a first voltage terminal for receiving the first reference voltage VR1, and a second voltage terminal for receiving the second reference voltage VR2. The inverter 114 has an input terminal coupled to the local bit line LBL2, an output terminal coupled to the local bit line LBL1, a first voltage terminal for receiving the first reference voltage VR1, and a second voltage terminal for receiving the second reference voltage VR2. However, in some other embodiments, the latch 110 may be implemented by other different structures according to the system requirement.

The non-volatile storage elements 130A and 130B are of the same type, and the non-volatile storage element 130A can include a programmable resistor, a capacitor, or a non-volatile memory cell. For example, the non-volatile memory cell 130A can be a one-time programmable memory cell, multiple-time programmable memory cell, flash memory cell, resistive random access memory cell (ReRAM), magnetoresistive random access memory cell (MRAM), Ferroelectric random access memory cell (FeRAM), or phase change random access memory cell (PCRAM).

The voltage selector 120 has a first floating terminal, a second floating terminal, a program terminal for providing a program voltage VPP, and a pre-charge terminal for providing a pre-charge voltage VPre. The voltage selector 120 can couple the second terminal of the non-volatile storage element 130A to the first floating terminal, the program terminal or the pre-charge terminal, and can couple the second terminal of the non-volatile storage element 130B to the second floating terminal, the program terminal or the pre-charge terminal for facilitating different operations.

For example, during an initial operation, the voltage selector 120 can couple the second terminal of the non-volatile storage element 130A to the first floating terminal, and coupled the second terminal of the non-volatile storage element 130B to the second floating terminal. Since the second terminals of the non-volatile storage elements 130A and 130B are floating during the initial operation, according to the initial charge state of the latch 110, one of the local bit lines LBL1, LBL2 will be latched to the first reference voltage VR1 while the other local bit line will be latched to the second reference voltage VR2.

After the latch 110 is settled, the voltage selector 120 can couple the second terminals of the non-volatile storage elements 130A and 130B to the program terminal for receiving the program voltage VPP during an enroll operation. In some embodiments of the present invention, the program voltage VPP and the second reference voltage VR2 can be positive voltages, and the program voltage VPP can be greater than the second reference voltage VR2. To track the initial state of the latch 110, the voltage difference between the program voltage VPP and the first reference voltage VR1 can be large enough to program the non-volatile storage elements 130A and 130B.

In this case, if the local bit line LBL1 has been pulled down to the first reference voltage VR1 and the local bit line LBL2 has been pulled up to the second reference voltage VR2 due to the initial charge state of the latch 110, then the large voltage difference between the program voltage VPP and the first reference voltage VR1 will be applied to the non-volatile storage element 130A, and the non-volatile storage element 130A will be programmed. However, since the local bit line LBL2 is at the second reference voltage VR2, the voltage difference applied on the non-volatile storage element 130B will not be large enough to program the non-volatile storage element 130B. Consequently, the initial charge state of the latch 110 can be tracked by the states of the non-volatile storage elements 130A and 130B during the enroll operation. Since the initial charge state of the latch 110 is unpredictable, the state of the non-volatile storage elements 130A and 130B is also unpredictable and can be used to represent a random bit of the random bit cell 100.

Once the non-volatile storage element 130A is programmed, the resistance of the non-volatile storage element 130A will be dropped dramatically, thereby producing a charging current flowing to the first local bit line LBL1 and raising the voltage of the first local bit line LBL1. In this case, the latch 110 will pull down the voltage of the second local bit line LBL2 correspondingly. However, since the program voltage VPP is built by a charge pump, the program voltage VPP generated by the charge pump will drop as the charging current is produced, thereby preventing the non-volatile storage element 130B from being programmed. In some embodiments, the enroll operation can be determined to be completed by observing the voltage inversion on the local bit lines LBL1 and LBL2.

After the enroll operation is completed, the states of the non-volatile storage elements 130A and 130B can be read by applying the pre-charge voltage VPre smaller than the program voltage VPP to the second terminals of the non-volatile storage elements 130A and 130B. For example, during the read operation, the voltage selector 120 can couple the second terminal of the non-volatile storage element 130A and the second terminal of the non-volatile storage element 130B to the pre-charge terminal for receiving the pre-charge voltage VPre. In this case, since the non-volatile storage element 130A is programmed during the enroll operation, the resistance of the non-volatile storage element 130A will be much smaller than the resistance of the non-volatile storage element 130B. Therefore, the voltage of the local bit line LBL1 will be raised to a level close to the pre-charge voltage VPre through the non-volatile storage element 130A while the local bit line LBL2 will not be affected by the pre-charge voltage VPre due to the high resistance of the non-volatile storage element 130B.

In some embodiments, the pre-charge voltage VPre can be smaller than the second reference voltage VR2. However, once the local bit line LBL1 is raised by the pre-charge voltage VPre, the latch 110 will be triggered to further settle the local bit line LBL1 to be the second reference voltage VR2 and keep the local bit line LBL2 at the first reference voltage VR1. Consequently, by sensing the voltages on the local bit lines LBL1 and LBL2, the random bit represented by the states of the non-volatile storage elements 130A and 130B can be read.

Since the initial charge state of the latch 110 can be tracked by the structural change of the non-volatile storage elements 130A and 130B, the random bit generated by the random bit cell 100 can be stored stably without being affected by the repeated power resetting.

In some embodiments, the second terminals of the non-volatile storage elements 130A and 130B can be coupled to the program terminal for receiving the program voltage VPP through the same node during the enroll operation, and the and second terminals of the non-volatile storage elements 130A and 130B can be coupled to the pre-charge terminal for receiving the pre-charge voltage VPre through the same node during the read operation. However, in some embodiments, as shown later in FIG. 2, the second terminals of the non-volatile storage elements 130A and 130B can be coupled to the program terminal through different nodes for receiving the program voltage VPP, and the second terminals of the non-volatile storage elements 130A and 130B can be coupled to the pre-charge terminal through different nodes for receiving the pre-charge voltage VPre.

Also, in some other embodiments of the present invention, the program voltage VPP can also be a negative voltage while the pre-charge voltage VPre and the second reference voltage VR2 are positive voltages. In this case, the voltage difference between the program voltage VPP and the second reference voltage VR2 can be large enough to program the non-volatile storage elements 130A and 130B. Therefore, during the enroll operation, if the local bit line LBL2 has been raised to the second reference voltage VR2 previously in the initial operation due to the initial charge state of the latch 110, the large voltage difference applied to the non-volatile storage element 130B will program the non-volatile storage element 130B. Consequently, the initial charge state of the latch 110 can be tracked by the states of the non-volatile storage elements 130A and 130B.

In this case, the pre-charge voltage VPre can be applied during the read operation, and the voltage of the local bit line LBL2 will be raised to a level close to the pre-charge voltage VPre due to the low resistance of the non-volatile storage element 130B. Also, the latch 110 will be triggered to further settle the local bit line LBL2 to be the second reference voltage VR2 and keep the local bit line LBL1 at the first reference voltage VR1. Consequently, by sensing the voltages on the local bit lines LBL1 and LBL2, the random bit represented by the states of the non-volatile storage elements 130A and 130B can be read.

Since the initial charge state of the latch 110 can be tracked by the structural change of the non-volatile storage elements 130A and 130B, the random bit generated by the random bit cell 100 can be stored stably without being affected by the repeated power resetting.

Figure 2:
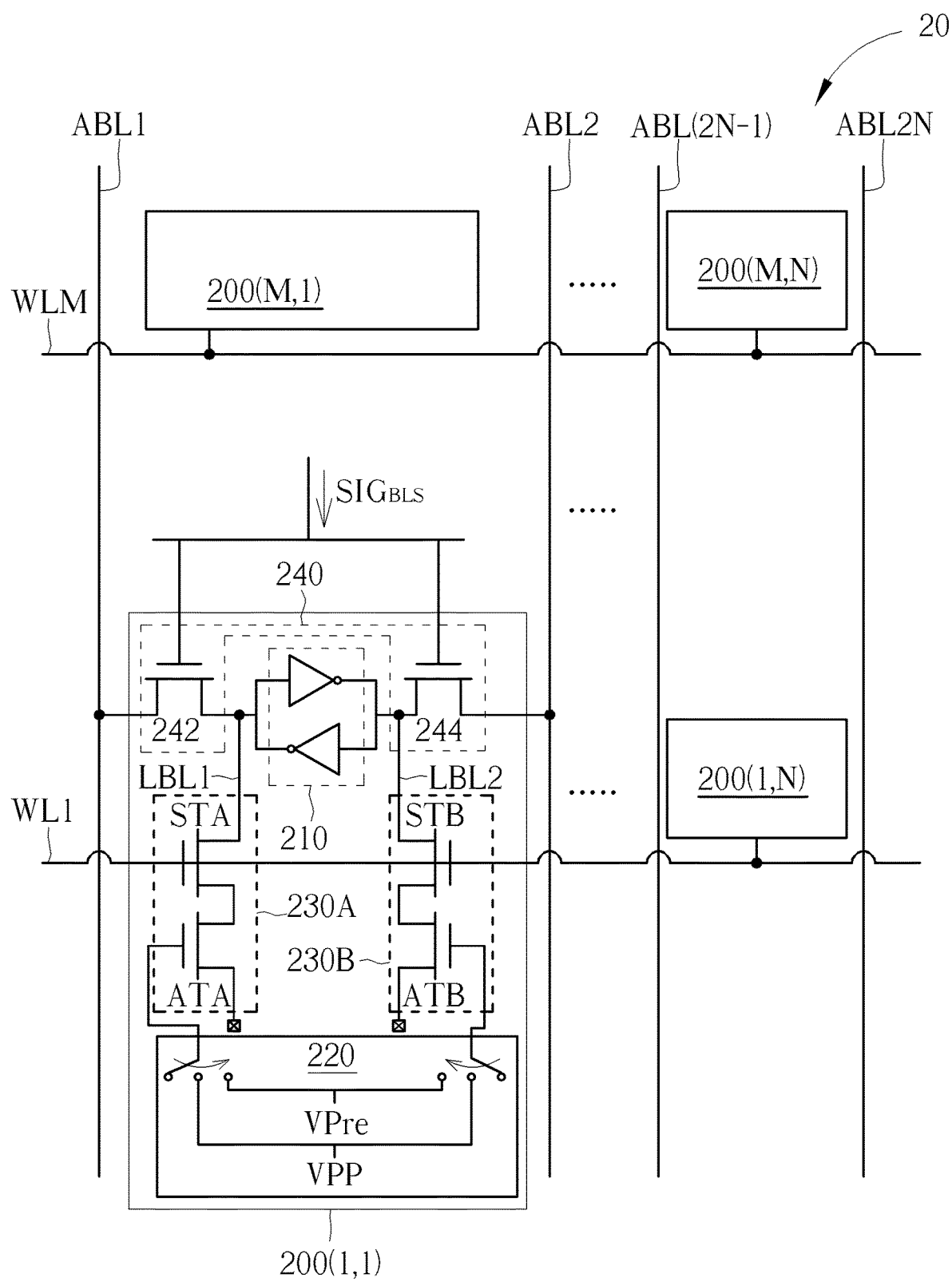
FIG. 2 shows a random number generator according to one embodiment of the present invention.

FIG. 2 shows a random number generator 20 according to one embodiment of the present invention. The random number generator 20 includes a plurality of address bit lines ABL1 to ABL2N, and a plurality of random bit cells $200_{(1,1)}$ to $200_{(M,N)}$, where M and N are positive integers greater than 1.

The random bit cells $200_{(1,1)}$ to $200_{(M,N)}$ can have the same structure as the random bit cell 100 shown in FIG. 1, and can be operated with the same principles. For example, in FIG. 2, the random bit cell $200_{(1,1)}$ can include a latch 210, a voltage selector 220, non-volatile storage elements 230A and 230B, and a bit line select circuit 240.

With the bit line select circuit 240, random bit cells coupled to the different address bit lines can be read by sharing the same sensing amplifier sequentially. For example, random bit cells $200_{(1,1)}$ to $200_{(M,1)}$ can be coupled to the same address bit lines ABL1 and ABL2, and random bit cells $200_{(1,N)}$ to $200_{(M,N)}$ can be coupled to the same address bit lines ABL(2N−1) and ABL2N.

In the random bit cell $200_{(1,1)}$, the latch 210 can have a first terminal coupled to a local bit line LBL1, and a second terminal coupled to a local bit line LBL2. Also, the bit line select circuit 240 can be coupled to the local bit lines LBL1 and LBL2, and the address bit lines ABL1 and ABL2. In FIG. 2, the bit line select circuit 240 can include bit line select transistors 242 and 244. The bit line select transistor 242 has a first terminal coupled to the local bit line LBL1, a second terminal coupled to the address bit line ABL1, and a control terminal for receiving a bit line select signal $SIG_{BLS}$. The bit line select transistor 244 has a first terminal coupled to the local bit line LBL2, a second terminal coupled to the address bit line ABL2, and a control terminal for receiving the bit line select signal $SIG_{BLS}$. In this case, the random number generator 20 can use the bit line select circuits 240 of the random bit cells $200_{(1,1)}$ to $200_{(1,N)}$ to select the random bit cell to be read among the random bit cells $200_{(1,1)}$ to $200_{(1,N)}$ when the word line WL1 is selected.

Also, the random bit cells $200_{(1,1)}$ to $200_{(1,N)}$ can be coupled to the same word line WL1, and the random bit cells $200_{(M,1)}$ to $200_{(M,N)}$ can be coupled to the same word line WLM. In this case, the non-volatile storage elements 230A and 230B of the random bit cells $200_{(1,1)}$ to $200_{(M,N)}$ can include select transistors for decoding the word line selection.

For example, in FIG. 2, in the random bit cell $200_{(1,1)}$, the non-volatile memory cell 230A can include a select transistor STA and an anti-fuse transistor ATA. The select transistor STA has a first terminal coupled to the local bit line LBL1, a second terminal, and a control terminal coupled to a word line WL1. The anti-fuse transistor ATA has a first terminal coupled to the second terminal of the select transistor STA, a second terminal, and a control terminal coupled to the voltage selector 220.

Also, the non-volatile memory cell 230B can include a select transistor STB and an anti-fuse transistor ATB. The select transistor STB has a first terminal coupled to the local bit line LBL2, a second terminal, and a control terminal coupled to the word line WL1. The anti-fuse transistor ATB has a first terminal coupled to the second terminal of the select transistor STB, a second terminal, and a control terminal coupled to the voltage selector 220.

Consequently, the select transistors STA and STB can be used to select the random bit cell to be read from the random bit cells $200_{(1,1)}$ to $200_{(M,1)}$ when address bit lines ABL1 and ABL2 are selected.

Also, in some embodiments, the random bit cells coupled to the same word line can be seemed as in the same page, and can perform the initial operation and the enroll operation simultaneously. That is, the random bit cells in the same page can be tracked simultaneously. In some embodiments, the random bits generated by the same page of random bit cells can be combined to form the random number required for generating the security key.

However, in some other embodiments, the random number generator 20 may have different addressing schemes, and may include different bit line selectors and/or word line selectors for address decoding according to the application needs.

Figure 3:
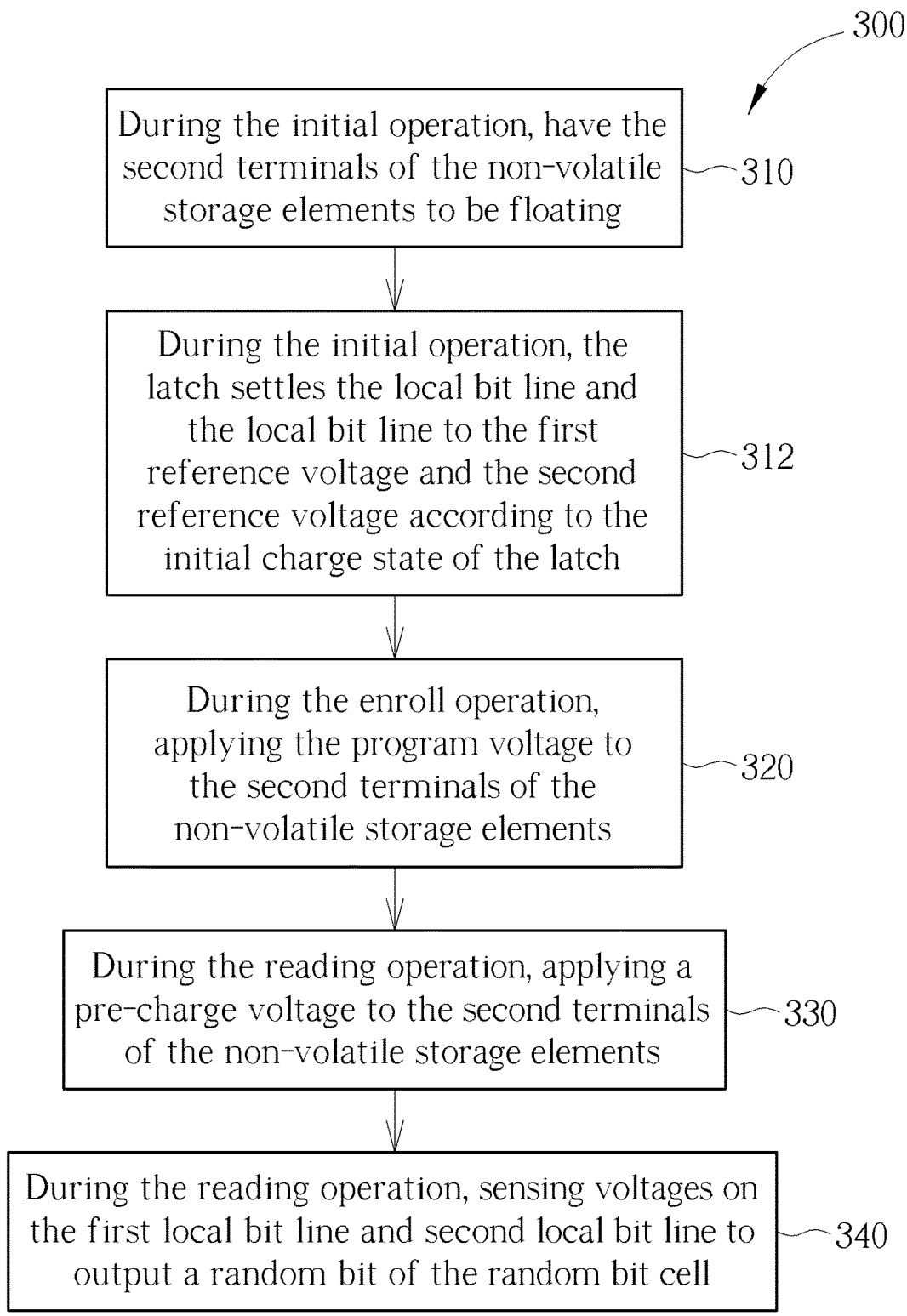
FIG. 3 shows a method for operating the random bit cell in FIG. 1 according to one embodiment of the present invention.

FIG. 3 shows a method 300 for operating the random bit cell 100 according to one embodiment of the present invention. The method 300 includes steps S310 to S340.

S310: during the initial operation, have the second terminal of the non-volatile storage element 130A and the second terminal of the non-volatile storage element 130B to be floating;

S312: during the initial operation, the latch 110 settles the local bit line LBL1 and the local bit line LBL2 to the first reference voltage VR1 and the second reference voltage VR2 according to the initial charge state of the latch 110;

S320: during the enroll operation, applying the program voltage VPP to the second terminal of the non-volatile storage element 130A and the second terminal of the non-volatile storage element 130B;

S330: during the read operation, applying a pre-charge voltage VPre to the second terminal of the non-volatile storage element 130A and the second terminal of the non-volatile storage element 130B; and S340: during the read operation, sensing voltages on the local bit line LBL1 and LBL2 to output a random bit of the random bit cell 100.

In step S310, the voltage selector 120 can couple the second terminal of the non-volatile storage element 130A to the first floating terminal, and couple the second terminal of the non-volatile storage element 130B to the second floating terminal. In this case, the latch 110 can settle the local bit line LBL1 and the local bit line LBL2 to the first reference voltage VR1 and the second reference voltage VR2 according to the initial charge state of the latch 110 in step S312 during the initial operation.

After the initial operation is performed, the voltage selector 120 can couple the second terminals of the non-volatile storage elements 130A and 130B to the program terminal for providing the program voltage VPP in step S320. In this case, one of the non-volatile storage elements 130A and 130B will be programmed according to the initial charge state of the latch 110.

Since the resistance of the non-volatile storage element being programmed will be reduced significantly, the latch 110 can be triggered by the pre-charge voltage VPre and output the random bit according to the states of the non-volatile storage elements 130A and 130B. For example, in step S330, the voltage selector 120 can couple the second terminals of the non-volatile storage elements 130A and 130B to the pre-charge terminal for providing the pre-charge voltage VPre. In this case, the non-volatile storage element being programmed will be more conductive and pass the pre-charge voltage VPre to the corresponding local bit line, thereby triggering the latch 110 to output the random number bit through the local bit lines LBL1 and LBL2.

With method 300, the unpredictable initial charge state of the latch 110 can be tracked by the structural states of the non-volatile storage elements 130A and 130B during the enroll operation, so the random bit generated by the random bit cell 100 can be stored stably without being affected by the repeated power resetting.

In summary, the random bit cells, random number generators, and the method for operating the random bit cells provided by the embodiments of the present invention can track the initial charge state of the latches with the structural states of the non-volatile storage elements. Since the structural states of the non-volatile storage elements are immune from the affections of power resetting, the random number bits or the random numbers generated according to the present invention can be stored stably.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A random bit cell comprising:
a latch having a first terminal coupled to a first local bit line, and a second terminal coupled to a second local bit line;
a voltage selector having a first floating terminal, a second floating terminal, a program terminal configured to provide a program voltage, and a pre-charge terminal configured to provide a pre-charge voltage;
a first non-volatile storage element having a first terminal coupled to the first local bit line, and a second terminal coupled to the voltage selector; and
a second non-volatile storage element having a first terminal coupled to the second local bit line, and a second terminal coupled to the voltage selector;
wherein:
during an initial operation:
the latch settles the first local bit line and the second local bit line to a first reference voltage and a second reference voltage greater than the first reference voltage according to an initial charge state of the latch; and
the voltage selector couples the second terminal of the first non-volatile storage element to the first floating terminal, and the second terminal of the second non-volatile storage element to the second floating terminal;
during an enroll operation, the voltage selector couples the second terminal of the first non-volatile storage element and the second terminal of the second non-volatile storage element to the program terminal; and
during a read operation:

the voltage selector couples the second terminal of the first non-volatile storage element and the second terminal of the second non-volatile storage element to the pre-charge terminal; and
a random bit of the random bit cell is read by sensing voltages on the first local bit line and the second bit line.

2. The random bit cell of claim 1, wherein the latch comprises:
a first inverter having an input terminal coupled to the first local bit line, an output terminal coupled to the second local bit line, a first voltage terminal configured to receive the first reference voltage, and a second voltage terminal configured to receive the second reference voltage; and
a second inverter having an input terminal coupled to the second local bit line, an output terminal coupled to the first local bit line, a first voltage terminal configured to receive the first reference voltage, and a second voltage terminal configured to receive the second reference voltage.

3. The random bit cell of claim 1, wherein:
the program voltage, the pre-charge voltage and the second reference voltage are positive voltages;
the program voltage is greater than the second reference voltage and the pre-charge voltage; and
a voltage difference between the program voltage and the first reference voltage is large enough to program the first non-volatile storage element and the second non-volatile storage element.

4. The random bit cell of claim 1, wherein:
the program voltage is a negative voltage;
the pre-charge voltage and the second reference voltage are positive voltages; and
a voltage difference between the program voltage and the second reference voltage is large enough to program the first non-volatile storage element and the second non-volatile storage element.

5. The random bit cell of claim 1, wherein the first non-volatile storage element and the second non-volatile storage element are of a same type, and the first non-volatile storage element comprises a programmable resistor, a capacitor, or a non-volatile memory cell.

6. The random bit cell of claim 5, wherein the non-volatile memory cell comprises a one-time programmable memory cell, multiple-time programmable memory cell, flash memory cell, resistive random access memory cell (ReRAM), magnetoresistive random access memory cell (MRAM), Ferroelectric random access memory cell (FeRAM), or phase change random access memory cell (PCRAM).

7. The random bit cell of claim 1, wherein:
the first non-volatile memory cell comprises:
a first select transistor having a first terminal coupled to the first local bit line, a second terminal, and a control terminal coupled to a word line; and
a first anti-fuse transistor having a first terminal coupled to the second terminal of the first select transistor, a second terminal, and a control terminal coupled to the voltage selector; and
the second non-volatile memory cell comprises:
a second select transistor having a first terminal coupled to the second local bit line, a second terminal, and a control terminal coupled to the word line; and
a second anti-fuse transistor having a first terminal coupled to the second terminal of the second select transistor, a second terminal, and a control terminal coupled to the voltage selector.

8. A random number generator comprising:
a plurality of address bit lines; and
a plurality of random bit cells, each comprising:
a latch having a first terminal coupled to a first local bit line, and a second terminal coupled to a second local bit line;
a bit line select circuit coupled to the first local bit line, the second local bit line, a first corresponding address bit line of the plurality of address bit lines, and a second corresponding address bit line of the plurality of address bit lines;
a voltage selector having a first floating terminal, a second floating terminal, a program terminal configured to provide a program voltage, and a pre-charge terminal configured to provide a pre-charge voltage;
a first non-volatile storage element having a first terminal coupled to the first local bit line, and a second terminal coupled to the voltage selector; and
a second non-volatile storage element having a first terminal coupled to the second local bit line, and a second terminal coupled to the voltage selector;
wherein:
during an initial operation of the random bit cell:
the latch settles the first local bit line and the second local bit line to a first reference voltage and a second reference voltage greater than the first reference voltage according to an initial charge state of the latch; and
the voltage selector couples the second terminal of the first non-volatile storage element to the first floating terminal, and the second terminal of the second non-volatile storage element to the second floating terminal;
during an enroll operation of the random bit cell, the voltage selector couples the second terminal of the first non-volatile storage element and the second terminal of the second non-volatile storage element to the program terminal; and
during a read operation:
the voltage selector couples the second terminal of the first non-volatile storage element and the second terminal of the second non-volatile storage element to the pre-charge terminal; and
a random bit of the random bit cell is read by sensing voltages on the first local bit line and the second bit line.

9. The random number generator of claim 8, wherein the latch comprises:
a first inverter having an input terminal coupled to the first local bit line, an output terminal coupled to the second local bit line, a first voltage terminal configured to receive the first reference voltage, and a second voltage terminal configured to receive the second reference voltage; and
a second inverter having an input terminal coupled to the second local bit line, an output terminal coupled to the first local bit line, a first voltage terminal configured to receive the first reference voltage, and a second voltage terminal configured to receive the second reference voltage.

10. The random number generator of claim 8, wherein:
the program voltage, the pre-charge voltage and the second reference voltage are positive voltages;
the program voltage is greater than the second reference voltage and the pre-charge voltage; and a voltage difference between the program voltage and the first reference voltage is large enough to program the first non-volatile storage element and the second non-volatile storage element.

11. The random number generator of claim 8, wherein:
the program voltage is a negative voltage; and
the pre-charge voltage and the second reference voltage are positive voltages; and
a voltage difference between the program voltage and the second reference voltage is large enough to program the first non-volatile storage element and the second non-volatile storage element.

12. The random number generator of claim 8, wherein the first non-volatile storage element and the second non-volatile storage element are of a same type, and the first non-volatile storage element comprises a programmable resistor, a capacitors, or a non-volatile memory cell.

13. The random number generator of claim 12, wherein the non-volatile memory cell comprises a one-time programmable memory cell, multiple-time programmable memory cell, flash memory cell, resistive random access memory cell (ReRAM), magnetoresistive random access memory cell (MRAM), Ferroelectric random access memory cell (FeRAM), or phase change random access memory cell (PCRAM).

14. The random number generator of claim 8, wherein:
the first non-volatile memory cell comprises:
  a first select transistor having a first terminal coupled to the first local bit line, a second terminal, and a control terminal coupled to a word line; and
  a first anti-fuse transistor having a first terminal coupled to the second terminal of the first select transistor, a second terminal, and a control terminal coupled to the voltage selector; and
the second non-volatile memory cell comprises:
  a second select transistor having a first terminal coupled to the second local bit line, a second terminal, and a control terminal coupled to the word line; and
  a second anti-fuse transistor having a first terminal coupled to the second terminal of the second select transistor, a second terminal, and a control terminal coupled to the voltage selector.

15. The random number generator of claim 8, wherein bit line select circuit comprises:
a first bit line transistor having a first terminal coupled to the first local bit line, a second terminal coupled to the first corresponding address bit line, and a control terminal configured to receive a bit line select signal; and
a second bit line transistor having a first terminal coupled to the second local bit line, a second terminal coupled to the second corresponding address bit line, and a control terminal configured to receive the bit line select signal.

16. A method for operating a random bit cell, the random bit cell comprising a latch having a first terminal coupled to a first local bit line, and a second terminal coupled to a second local bit line, a first non-volatile storage element having a first terminal coupled to the first local bit line, and a second terminal, and a second non-volatile storage element having a first terminal coupled to the second local bit line, and a second terminal, the method comprising:
during an initial operation:
  having the second terminal of the first non-volatile storage element and the second terminal of the second non-volatile storage element to be floating; and
  the latch settling the first local bit line and the second local bit line to a first reference voltage and a second reference voltage greater than the first reference voltage according to an initial charge state of the latch; and
during an enroll operation, applying a program voltage to the second terminal of the first non-volatile storage element and the second terminal of the second non-volatile storage element; and
during a read operation:
  applying a pre-charge voltage to the second terminal of the first non-volatile storage element and the second terminal of the second non-volatile storage element; and
  sensing voltages on the first local bit line and the second bit line to output a random bit of the random bit cell.

17. The method of claim 16, wherein:
the program voltage, the pre-charge voltage and the second reference voltage are positive voltages;
the program voltage is greater than the second reference voltage and the pre-charge voltage; and
a voltage difference between the program voltage and the first reference voltage is large enough to program the first non-volatile storage element and the second non-volatile storage element.

18. The method of claim 16, wherein:
the program voltage is a negative voltage; and
the pre-charge voltage and the second reference voltage are positive voltages; and
a voltage difference between the program voltage and the second reference voltage is large enough to program the first non-volatile storage element and the second non-volatile storage element.

19. The method of claim 16, wherein the first non-volatile storage element and the second non-volatile storage element are of a same type, and the first non-volatile storage element comprises a programmable resistor, a capacitor, or a non-volatile memory cell.

20. The method of claim 19, wherein the non-volatile memory cell comprises a one-time programmable memory cell, multiple-time programmable memory cell, flash memory cell, resistive random access memory cell (ReRAM), magnetoresistive random access memory cell (MRAM), Ferroelectric random access memory cell (FeRAM), or phase change random access memory cell (PCRAM).

* * * * *